US012721161B2

(12) United States Patent
Chen et al.

(10) Patent No.: US 12,721,161 B2
(45) Date of Patent: Aug. 25, 2026

(54) THERMALLY CONDUCTIVE SEMICONDUCTOR PACKAGING STRUCTURE AND METHOD FOR PREPARING SAME

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 358 days.

(21) Appl. No.: 18/381,637

(22) Filed: Oct. 19, 2023

(65) Prior Publication Data

US 2024/0136245 A1 Apr. 25, 2024
US 2024/0234235 A9 Jul. 11, 2024

(30) Foreign Application Priority Data

Oct. 24, 2022 (CN) ......................... 202211305069.6

(51) Int. Cl.

| | |
|---|---|
| ***H10W 40/00*** | (2026.01) |
| ***H10W 20/00*** | (2026.01) |
| ***H10W 40/22*** | (2026.01) |
| ***H10W 70/685*** | (2026.01) |
| ***H10W 74/01*** | (2026.01) |
| ***H10W 90/00*** | (2026.01) |
| *H10W 72/20* | (2026.01) |
| *H10W 72/90* | (2026.01) |
| *H10W 74/00* | (2026.01) |

(52) U.S. Cl.

CPC ......... *H10W 40/22* (2026.01); *H10W 20/059* (2026.01); *H10W 70/685* (2026.01); *H10W 74/014* (2026.01); *H10W 90/701* (2026.01); *H10W 72/244* (2026.01); *H10W 72/252* (2026.01); *H10W 72/9226* (2026.01); *H10W 72/923* (2026.01); *H10W 72/942* (2026.01); *H10W 74/00* (2026.01)

(58) Field of Classification Search

CPC ..................................................... H10W 40/03
See application file for complete search history.

(56) References Cited

U.S. PATENT DOCUMENTS

2006/0197181 A1* 9/2006 Noguchi ............. H10W 40/228 257/E23.105
2018/0158749 A1* 6/2018 Yu ......................... H10W 40/22
2024/0170387 A1* 5/2024 Meade ................. G02B 6/4243

* cited by examiner

*Primary Examiner* — Christopher A Johnson
(74) *Attorney, Agent, or Firm* — IPRTOP LLC

(57) ABSTRACT

A thermally conductive semiconductor packaging structure includes a cooling component exposed on one surface and an electrical interconnecting component on the other surface. The cooling component has a thermally conductive die, its back side is provided with thermally conductive members extending away from the back side, and a front side is provided with pads to connect to the electrical interconnecting component. The electrical interconnecting component includes electrically conductive connectors to connect to the thermally conductive die, a rewiring layer, and metal bumps connecting to the rewiring layer. A substrate, electrically connected to the metal bumps and a heat dissipating cover over the substrate and in contact with the thermally conductive members. The package is applicable to a wide range of packages.

6 Claims, 7 Drawing Sheets

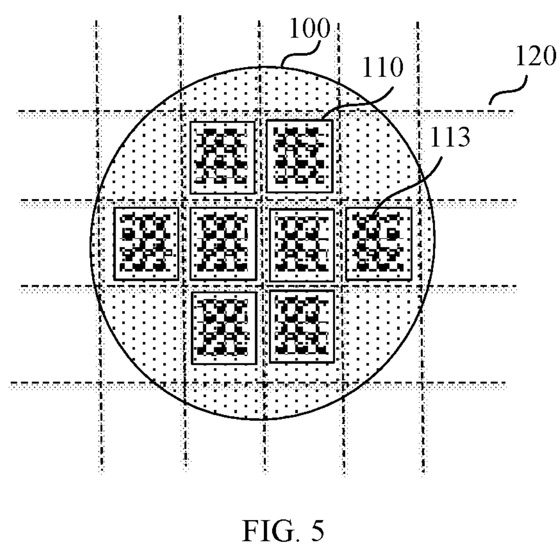
FIG. 5
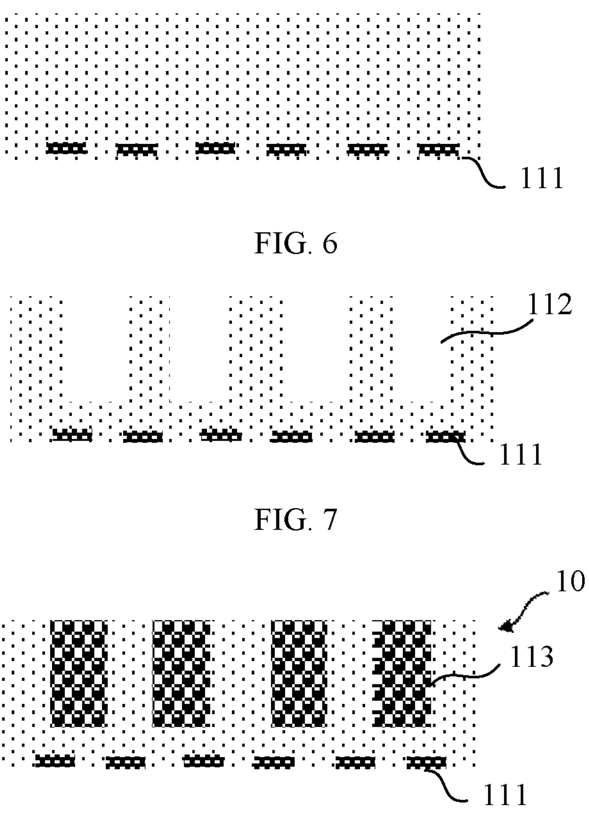
FIG. 6
FIG. 7
FIG. 8

THERMALLY CONDUCTIVE SEMICONDUCTOR PACKAGING STRUCTURE AND METHOD FOR PREPARING SAME

CROSS REFERENCE TO RELATED APPLICATION

The present application claims the benefit of priority to Chinese Patent Application No. 202211305069.6, entitled "THERMALLY CONDUCTIVE SEMICONDUCTOR PACKAGING STRUCTURE AND METHOD FOR PREPARING SAME", filed with CNIPA on Oct. 24, 2022, the disclosure of which is incorporated herein by reference in its entirety for all purposes.

FIELD OF TECHNOLOGY

The present disclosure generally relates to semiconductor packaging technology, in particular, to a thermally conductive semiconductor packaging structure and a method for preparing the same.

BACKGROUND

One of the main pursuits of integrated circuit packaging technology is to achieve circuits that are not only more reliable and lower in cost, but also faster and denser. As we look to the future, the integration density of various electronic components in circuits will be enhanced by continually minimizing the feature size. Currently, common packaging methods include wafer-level chip-scale packaging (WLCSP), fan-out wafer-level packaging (FOWLP), flip-chip packaging, and package on package (POP), among others.

The advent of big data, cloud computing, and artificial intelligence has ushered in a new era where unprecedented computational power is sought after. This pursuit is fueling the rapid development of a variety of novel technologies within the semiconductor industry. Integrated chip packaging technology, which allows for connecting multiple chips placed on substrates, is gaining attention due to its ability to deliver higher performance compared to traditional single-chip packaging. However, as integrated chip packaging often houses high-power chips, addressing the heat dissipation issue within integrated chip packaging is of paramount importance.

SUMMARY

The present disclosure provides a method for preparing a thermally conductive semiconductor packaging structure, providing a wafer, which comprises multiple sub-regions, wherein pads are provided on front sides of the sub-regions; patterning back sides of the sub-regions to form grooves; filling the grooves with a thermally conductive material to form thermally conductive members; cutting the wafer along borders of the sub-regions to obtain thermally conductive dies; forming a die packaging structure by packaging one or more of the thermally conductive dies together, wherein each of the thermally conductive dies comprises a first surface and a second surface opposite to the first surface, with the first surface exposing the thermally conductive members, wherein the second surface is provided with electrically conductive connectors which are electrically connected to the pads; attaching the pads of the one or more of the thermally conductive dies to an electrical interconnecting component; providing a substrate, and electrically connecting the electrical interconnecting component to the substrate; and forming a heat dissipating cover over the substrate, wherein the heat dissipating cover is in contact with the thermally conductive members.

The present disclosure further provides a thermally conductive semiconductor packaging structure, which includes: a die packaging structure, comprising a first surface and a second surface opposite to the first surface, wherein the die packaging structure comprises a cooling component exposed by the first surface of the die packaging structure and an electrical interconnecting component provided on the second surface of the die packaging structure; wherein the cooling component comprises a thermally conductive die, wherein a back side of thermally conductive die is provided with thermally conductive members extending away from the back side, wherein the thermally conductive members comprise grooves filled with a thermally conductive material and a front side of the thermally conductive die is provided with pads to connect to the electrical interconnecting component, and wherein the electrical interconnecting component comprises electrically conductive connectors, wherein the electrically conductive connectors connect the pads so as to attach to the thermally conductive die, a rewiring layer connecting to the electrically conductive connectors, and metal bumps connecting to the rewiring layer; a substrate, electrically connected to the metal bumps; and a heat dissipating cover, disposed over the substrate and in contact with the thermally conductive members.

As described above, the present disclosed thermally conductive semiconductor packaging structure and method for preparing the same, by attaching thermally conductive members to a die, can convert the die into a thermally conductive die with good thermal conductivity and applicable to a wide range of packages, thereby further obtaining a thermally conductive semiconductor packaging structure with high thermal conductivity and improved heat dissipation performance.

BRIEF DESCRIPTION OF THE DRAWINGS

FIG. 5 illustrates cutting the wafer to obtain thermally conductive dies according to one embodiment of the present disclosure.

FIG. 6 is a cross-sectional view of one of the sub-regions shown in FIG. 2.

FIG. 7 is a cross-sectional view of one of the sub-regions shown in FIG. 3.

FIG. 8 is a cross-sectional view of one of the sub-regions shown in FIG. 4.

REFERENCE NUMERALS

Figure 1:
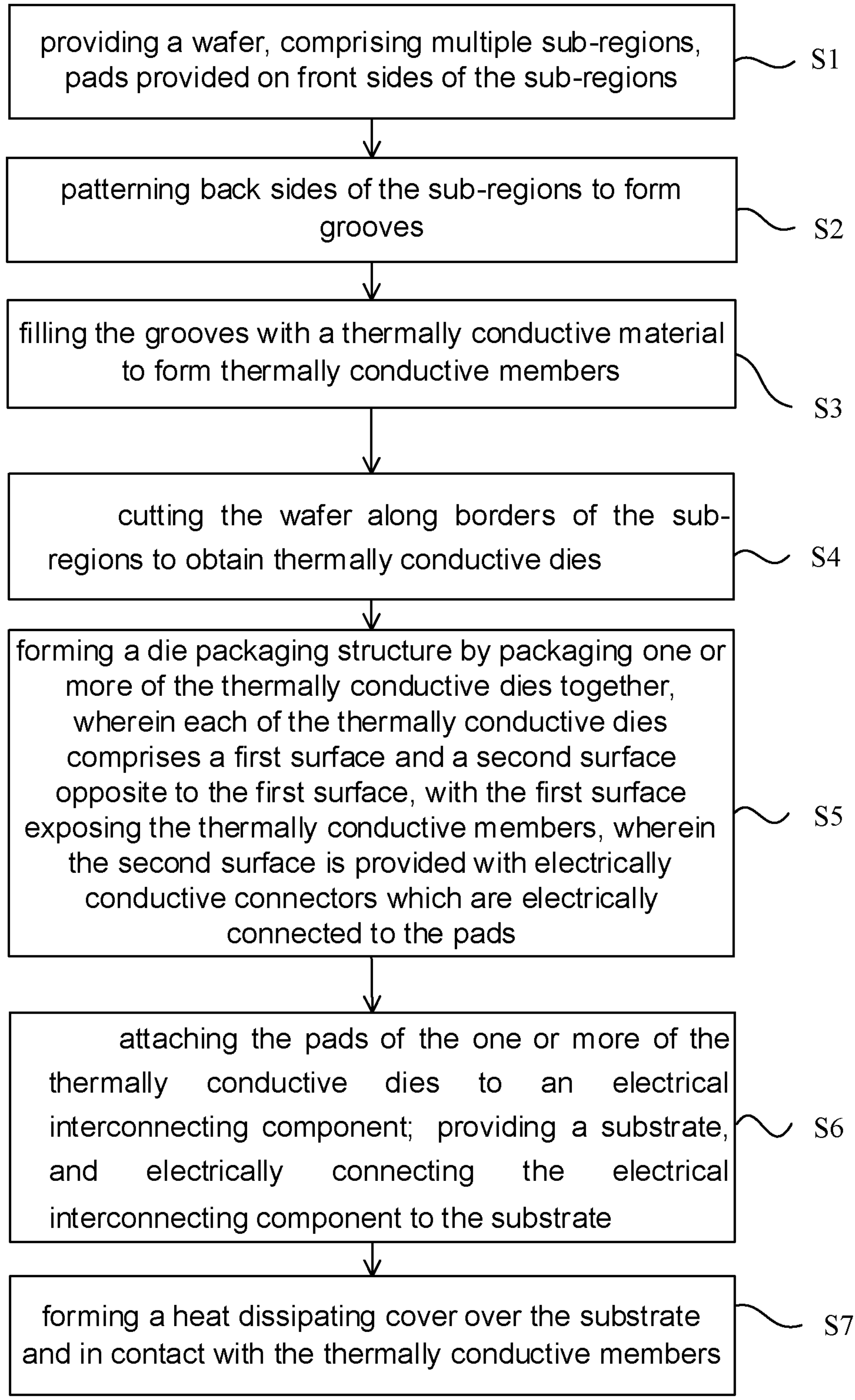
FIG. 1 shows a flowchart of a method for preparing a thermally conductive semiconductor packaging structure according to one embodiment of the present disclosure.

100 wafer; 110 sub-region; 111 pad; 112 groove; 113 thermally conductive member; 120 cutting line; 10 thermally conductive die; 210 first support layer; 220 first separation layer; 230 rewiring layer; 240 metal bump; 250 bottom filling layer; 260 plastic sealing layer; 270 second separation layer; 280 second support layer; 290 metal bump; 21 fan-out die packaging structure; 310 substrate; 320 bottom filling layer; 330 thermally conductive adhesive layer; 340 heat dissipating cover; 22 2.5D die packaging structure; 23 flip-chip die packaging structure.

DETAILED DESCRIPTION

Embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

When describing the embodiments of the present disclosure, for better explanation, cross-sectional structural diagrams may be partially enlarged without following the general scale. Moreover, the diagrams are only examples and should not limit the scope of the present disclosure. In addition, the actual production should comprise the length, width and depth of the three-dimensional space dimensions.

For the convenience of description, spatial relation terms such as "below", "under", "beneath", "on", "above", "up", etc. may be used herein to describe the relationships between an element or feature and other elements or features. It will be understood that these spatial relationship terms are intended to encompass directions/orientations of the device in use or operation other than those depicted in the drawings. In addition, when a first layer is referred to as being "between" a second layer and a third layer, the first layer may be the only layer between the second and third layers, or there may more layers between the two layers. Wherein, when an element is "fixed onto" or "disposed on" another element, it may be directly or indirectly on the other element. When an element is "attached to" or "connected to" another element, it may be directly or indirectly attached/connected to the other element.

Expressions such as "between . . . " may be used herein to indicate that two endpoints of the range are included, and expressions such as "several" may be used to indicate two or more, unless explicitly and specifically qualified otherwise. In addition, the terms like "first" and "second" are used for descriptive purpose only, and are not to be construed as indicating or implying relative importance or implicitly specifying numbers of technical features indicated. Thus, features qualified with terms like "first" and "second" may explicitly or implicitly comprise one or more such features.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the components' layout may also be more complicated.

As shown in FIG. 1, one embodiment of the present disclosure provides a method for preparing a thermally conductive semiconductor packaging structure, comprising steps S1-S7.

S1: providing a wafer, which comprises multiple sub-regions, wherein pads are provided on front sides of the sub-regions;

S2: patterning back sides of the sub-regions to form grooves in each of the sub-regions;

S3: filling the grooves with a thermally conductive material followed by wafer backside surface cleaning to form thermally conductive members;

S4: cutting the wafer along borders of the sub-regions to obtain thermally conductive dies;

S5: packaging the thermally conductive dies to form the die packaging structures, wherein one of the die packaging structures comprises a first surface and a second surface opposite to the first surface, with the first surface exposing the thermally conductive members, wherein the second surfaces are provided with electrically conductive connectors which are electrically connected to the pads;

S6: providing a substrate, and electrically connecting the electrically conductive connectors to the substrate; and S7: forming a heat dissipating cover over the substrate, with the heat dissipating cover in contact with the thermally conductive members.

The present disclosed method for preparing the thermally conductive semiconductor packaging structure, by introducing the thermally conductive members to the die, can convert the die into a thermally conductive die with good thermal conductivity and applicable to a wide range of packages, thereby further obtaining the thermally conductive semiconductor packaging structure with high thermal conductivity and improved heat dissipation performance.

The preparation of the intermediate fan thermally conductive die is further described below referring to FIGS. 2 to 8.

Figure 2:
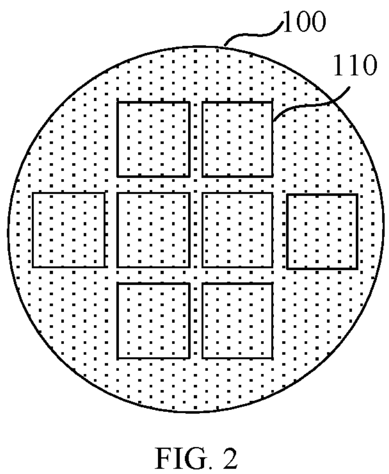
FIG. 2 shows a wafer with predefined sub-regions according to one embodiment of the present disclosure.

First, referring to FIG. 2 and FIG. 6, step S1 comprises: providing a wafer 100, wherein the wafer 100 comprises a plurality of sub-regions 110, and pads 111 are provided on front sides of the sub-regions 110.

Specifically, the wafer 100 may be, for example, a 4-6-inch wafer, an 8-inch wafer, a 12-inch wafer, etc. The sides having the pads 111 are the front sides of the sub-regions 110, the pads 111 facilitate electrical lead-out of the sub-regions 110, and the sides away from the pads 111 are the back sides of the sub-regions.

Figure 3:
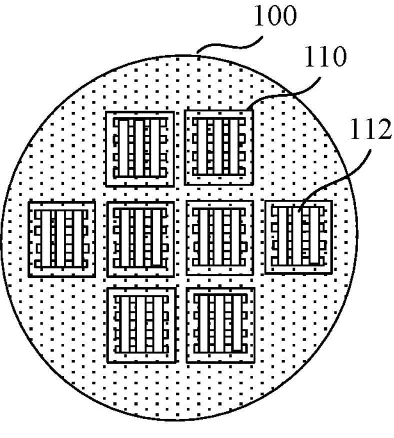
FIG. 3 shows the wafer with grooves formed on the back side of the wafer according to one embodiment of the present disclosure.

Next, referring to FIGS. 3 and 7, step S2 comprises: patterning the back sides of the sub-regions 110 to form grooves 112.

As an example, techniques of forming the grooves 112 may comprise one or more of mechanical grooving, laser grooving, chemical etching, and plasma etching. Shapes and sizes of the grooves 112 may be selected according to actual needs, for example, the grooves 112 may be circular, rectangular, or trapezoidal; similarly, depths of the grooves 112 may be set according to actual needs. The number of grooves 112 provided on the back side of each sub-region 110 may be one or more; grooves 112 on back sides of different sub-regions 110 may have the same shape or different shapes.

Figure 4:
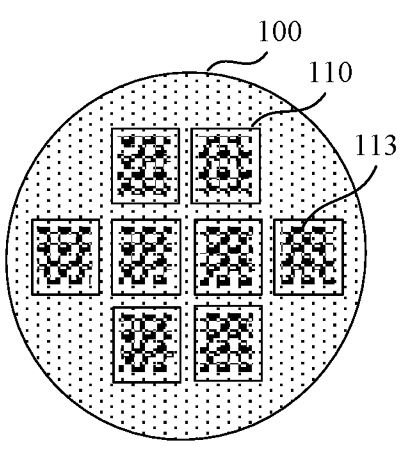
FIG. 4 shows the wafer having its grooves filled with a thermally conductive material according to one embodiment of the present disclosure.

Next, referring to FIGS. 4 and 8, step S3 comprises: filling the grooves 112 with a thermally conductive material followed by cleaning the backsides to expose the thermally conductive material to form thermally conductive members 113.

As an example, the thermally conductive material may be one or more of Graphene, aluminum trioxide, ceramics, and indium.

Specifically, the thermally conductive material has good thermal conductivity, thereby effectively improving the heat dissipation performance of the sub-regions 110. Therein, techniques of forming the thermally conductive members 113 may comprise coating, curing and grinding; specifically, the thermally conductive material may be first configured as a liquid substance with a certain degree of fluidity as needed, and therefore the grooves 112 may be filled by means of coating the thermally conductive material, and heating and curing processes may be carried out thereafter in order to solidify the thermally conductive material. Further, in order to obtain flat surfaces, after filling and curing the thermally conductive material, a polishing technique, such as chemical-mechanical polishing may be used to remove excess thermally conductive material, so that the thermally conductive members 113 formed and the back sides of the sub-regions 110 have surfaces with a high degree of flatness, in order to facilitate subsequent processes.

Next, referring to FIGS. 5 and 8, step S4 comprises: cutting the wafer 100 to obtain thermally conductive dies 10.

Specifically, as shown in FIG. 5, the wafer 100 is provided with cutting lines 120, along which the wafer 100 is cut to separate the sub-regions 110 from each other, and to obtain the thermally conductive dies 10, which have high heat dissipation performance. As the thermally conductive dies 10 have the thermally conductive members 113 inside them and thus have better thermal conductivity, they can be applied in a wider range of packaging structures.

As an example, each of the thermally conductive dies 10 may have N thermally conductive members 113, wherein N is an integer, N≥2.

Specifically, the grooves maybe along one direction, or along perpendicular directions as shown in FIG. 3, but one thermally conductive member is one internally connected structure 113. For example, the number of thermally conductive members 113 in each die can be equal to the number of grooves 110 if only one directional grooves are formed in each die, while the grooves are not interconnected with each other. To ensure the mechanical strength of the thermally conductive dies 10 and to realize the heat dissipation performance of the thermally conductive dies 10, it is preferred that the number N of grooves 110 on each die is two or more, for example, N is a positive integer 1, 2, . . . N.

Next, step S5 comprises: packaging the thermally conductive dies 10 to obtain die packaging structures. Each of the die packaging structures comprises a first surface and a second surface opposite to the first surface, with the first surface exposing the thermally conductive members 113, wherein the second surfaces are provided with electrically conductive connectors (not specifically shown in the figures) which are electrically connected to the pads 111.

As an example, the thermally conductive dies 10 may be applicable to a fan-out packaging structure, a 2.5D packaging structure or a flip-chip packaging structure. The case where the thermally conductive dies 10 are applied to a fan-out packaging structure is further described below referring to FIGS. 9 to 16.

Figure 9:
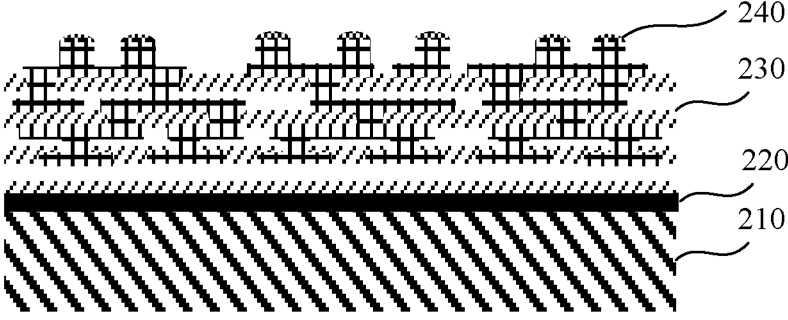
FIG. 9 shows a schematic structural diagram of an intermediate fan-out die packaging structure before thermally conductive dies are attached thereto, according to one embodiment of the present disclosure.

First, referring to FIG. 9, a semiconductor structure having a first support layer 210, a first separation layer 220, a rewiring layer 230, and first metal bumps 240 stacked from bottom to top in this order is provided, wherein the first metal bumps 240 are electrically connected to the rewiring layer 230.

Figure 10:
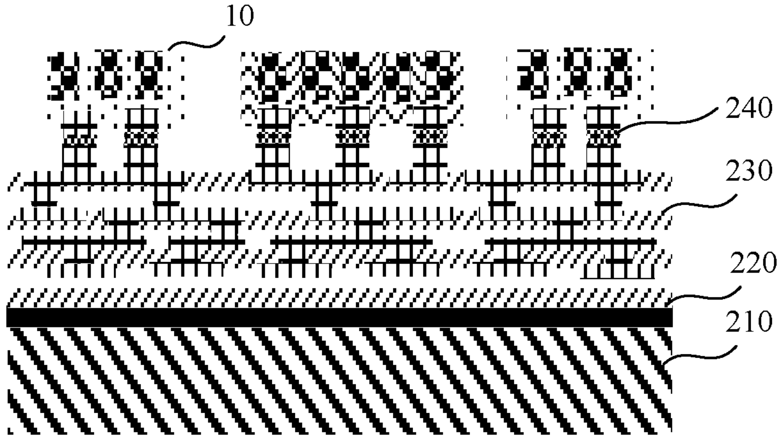
FIG. 10 shows a schematic structural diagram of an intermediate fan-out die packaging structure after the thermally conductive dies are attached thereto, according to one embodiment of the present disclosure.

Next, referring to FIG. 10, one or more thermally conductive dies 10 are electrically connected to the first metal bumps 240 via their pads 111.

Figure 11:
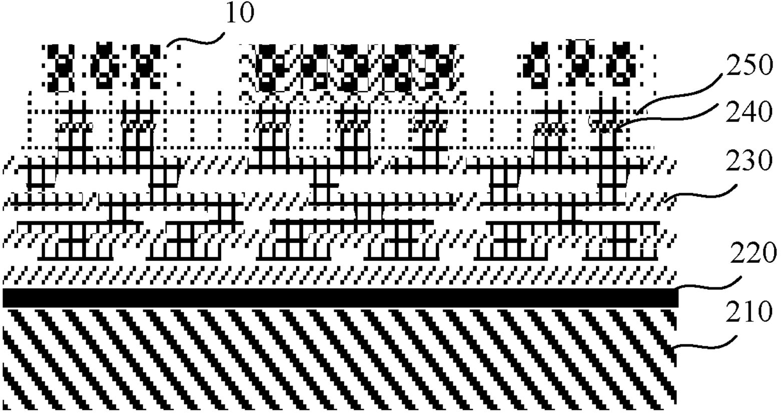
FIG. 11 shows a schematic structural diagram of an intermediate fan-out die packaging structure after a bottom filling layer is formed, according to one embodiment of the present disclosure.

Next, referring to FIG. 11, a bottom filling layer 250 is formed between the rewiring layer 230 and the thermally conductive dies 10 to protect the thermally conductive dies 10 and the first metal bumps 240.

Figures 12, 13, 14:
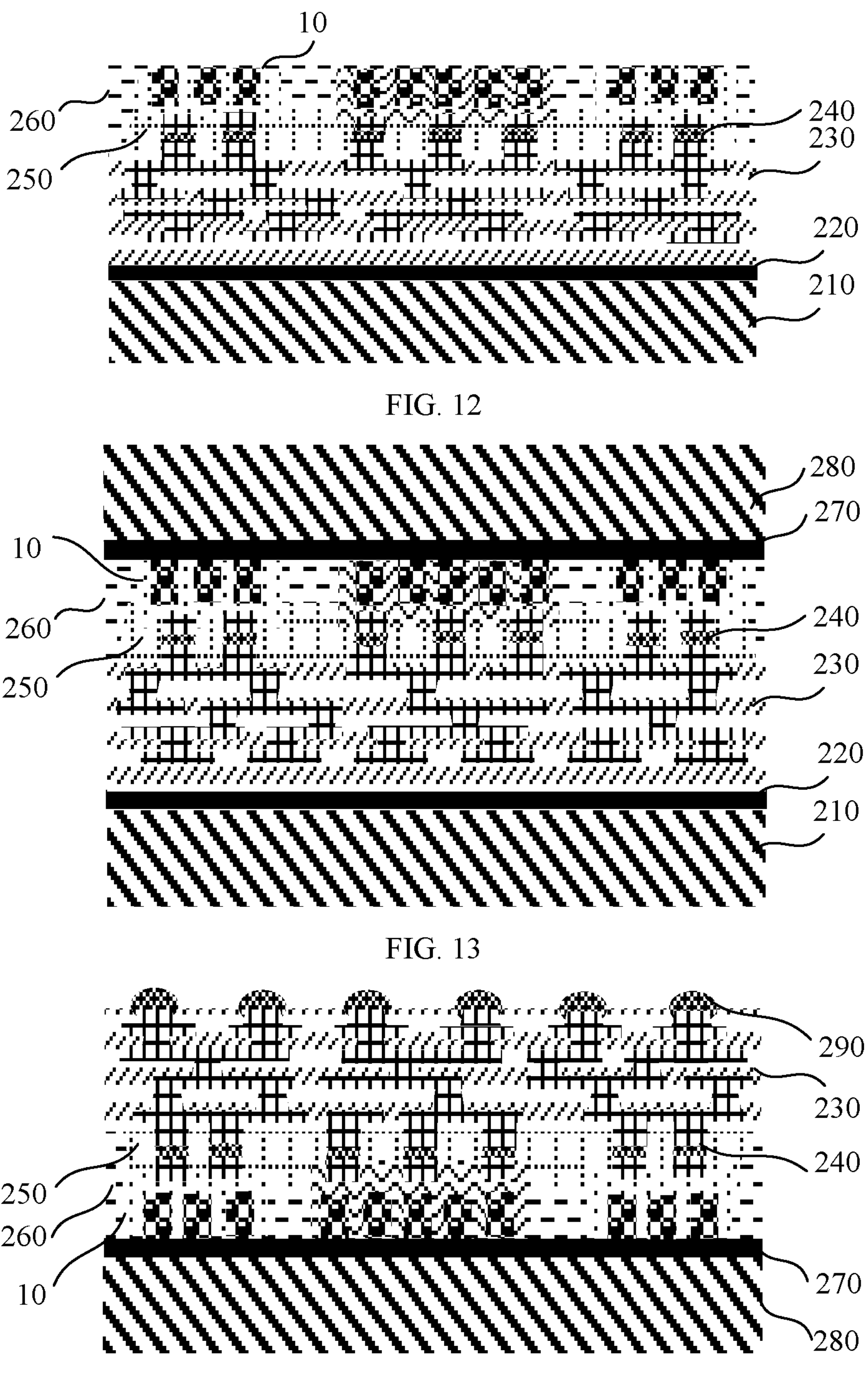
FIG. 12 shows a schematic structural diagram of an intermediate fan-out die packaging structure after a plastic sealing layer is formed, according to one embodiment of the present disclosure.
FIG. 13 shows a schematic structural diagram of an intermediate fan-out die packaging structure after a second support layer is formed, according to one embodiment of the present disclosure.
FIG. 14 shows a schematic structural diagram of an intermediate fan-out die packaging structure after a first support layer is removed and electrically conductive connectors are provided, according to one embodiment of the present disclosure.

Next, referring to FIG. 12, a plastic sealing layer 260 is formed to enclose the thermally conductive dies 10; preferably a polishing process is then performed to expose the thermally conductive members 113 of the thermally conductive dies 10, thereby further improving the thermal conduction efficiency of the thermally conductive dies 10.

Next, referring to FIG. 13, a second separation layer 270 and a second support layer 280 are formed on a surface of the plastic sealing layer 260.

Next, referring to FIG. 14, the first separation layer 220 and the first support layer 210 are removed, with the second support layer 280 used as the support, and second metal bumps 290 are formed on the rewiring layer 230, wherein the second metal bumps 290 are electrically connected to the rewiring layer 230, in which case the second metal bumps 290 are electrically connected to the pads 111 and act as the electrically conductive connectors, so that the thermally conductive dies 10 can be electrically led out.

Figure 15:
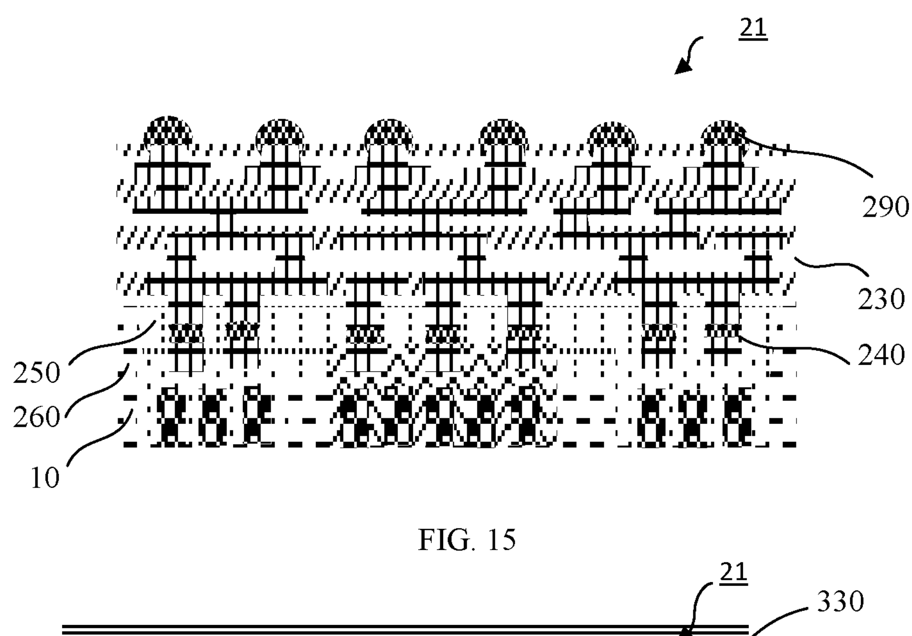
FIG. 15 shows a schematic structural diagram of an intermediate fan-out die packaging structure after the second support layer is removed, according to one embodiment of the present disclosure.

Next, referring to FIG. 15, the second separation layer 270 and the second support layer 280 are removed to expose the thermally conductive members 113 of the thermally conductive dies 10, at which point, the fan-out die packaging structure 21 is obtained. Materials, structures, and preparation of the support layers, separation layers, rewiring layer, metal bumps, plastic sealing layer, and bottom filling layer may be selected as desired.

Figure 17:
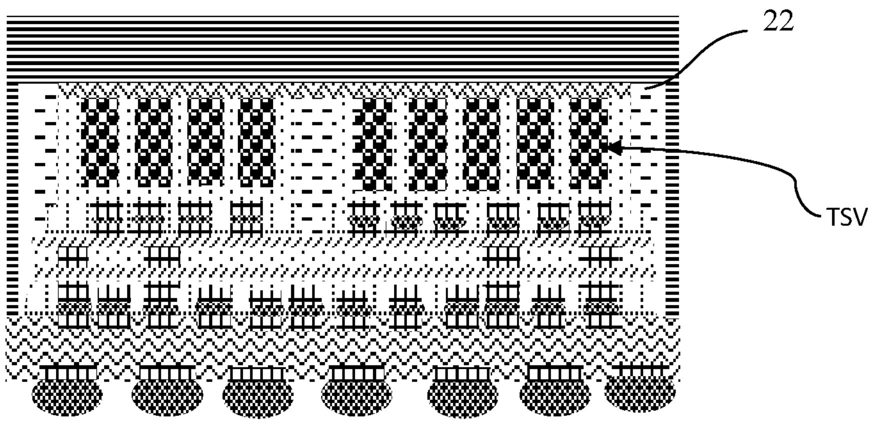
FIG. 17 shows a schematic structural diagram of a 2.5D thermally conductive semiconductor packaging structure according to one embodiment of the present disclosure.

In another example, referring to FIG. 17, the thermally conductive dies 10 may also be electrically connected to a silicon intermediary plate having through-silicon-vias (TSVs), thereby forming a 2.5D die packaging structure 22, wherein the 2.5D die packaging structure 22 may be prepared by replacing the rewiring layer 230 of the fan-out die packaging structure 21 with the silicon intermediary plate. In yet another example, referring to FIG. 18, the thermally conductive dies 10 may also be directly electrically connected to the substrate, so that the thermally conductive dies 10 can be directly applied to a flip-chip interconnection structure in a flip-chip die packaging structure 23. For more details of preparing the 2.5D die packaging structure 22 and the flip-chip die packaging structure 23, refer to descriptions of the fan-out die packaging structure 21.

Figure 16:
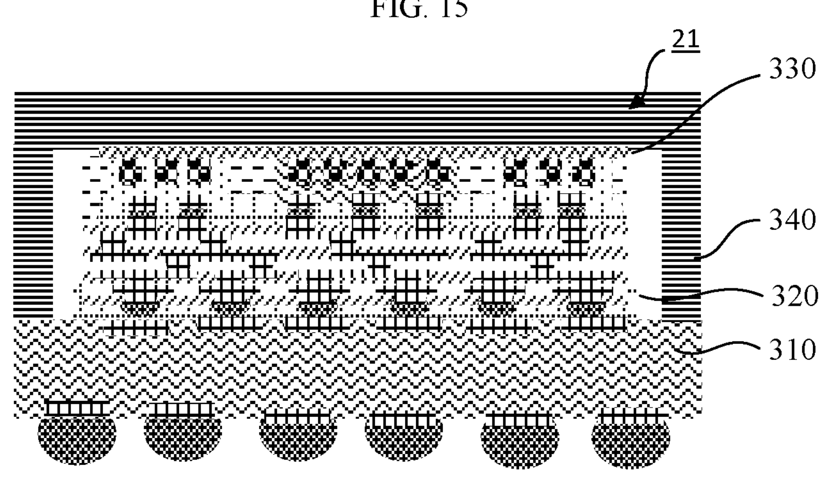
FIG. 16 shows a schematic structural diagram of a fan-out thermally conductive semiconductor packaging structure according to one embodiment of the present disclosure.

Next, referring to FIG. 16, step S6 comprises: provide a substrate 310, and electrically connecting the electrically conductive connectors (not shown in the figure) to the substrate 310.

As an example, the second metal bumps 290 serves as the electrically conductive connectors to electrically connect with the substrate 310, thereby realizing electrical connection between the fan-out die packaging structure 21 and the substrate 310. After the fan-out die packaging structure 21 is connected to the substrate 310, in some examples, a bottom filling layer 320 is formed to fill gaps between the fan-out die packaging structure 21 and the substrate 310. Similarly, after the 2.5D die packaging structure 22 or the flip-chip die packaging structure 23 is formed, electrical lead-out thereof can also be achieved through metal bumps.

Next, step S7 comprises: forming a heat dissipating cover 340 over the substrate 310 and in contact with the thermally conductive members 113.

Specifically, as shown in FIG. 16, the heat dissipating cover 340 may be fixed to the substrate 310 by an adhesive layer (not shown), and the fan-out die packaging structure 21 and the heat dissipating cover 340 may be contacted by a thermally conductive adhesive layer 330. The type of the heat dissipating cover 340 may be selected according to actual needs; for example, a heat dissipating cover with heat dissipating fins may be used.

A thermally conductive semiconductor packaging structure is further provided by the present disclosure, which may be prepared by the above process, but is not limited thereto. As an example, the thermally conductive semiconductor packaging structure is directly prepared by the above method for preparing the same.

Specifically, referring to FIGS. 2 to 16, the thermally conductive semiconductor packaging structure may comprise:

- a die packaging structure, comprising a first surface and a second surface opposite to the first surface, wherein the die packaging structure comprises a thermally conductive die 10 and electrically conductive connectors, wherein a front side of the thermally conductive die is provided with pads 111 and a back side of thermally conductive die is provided with thermally conductive members 113 extending inwardly from the back side, wherein the pads 111 are electrically connected with the electrically conductive connectors provided on the second surface of the die packaging structure, wherein the thermally conductive members 113 are exposed by the first surface of the die packaging structure;
- a substrate 310, electrically connected to the electrically conductive connectors; and
- a heat dissipating cover 340, disposed over the substrate 310 and in contact with the thermally conductive members 113.

Figure 18:
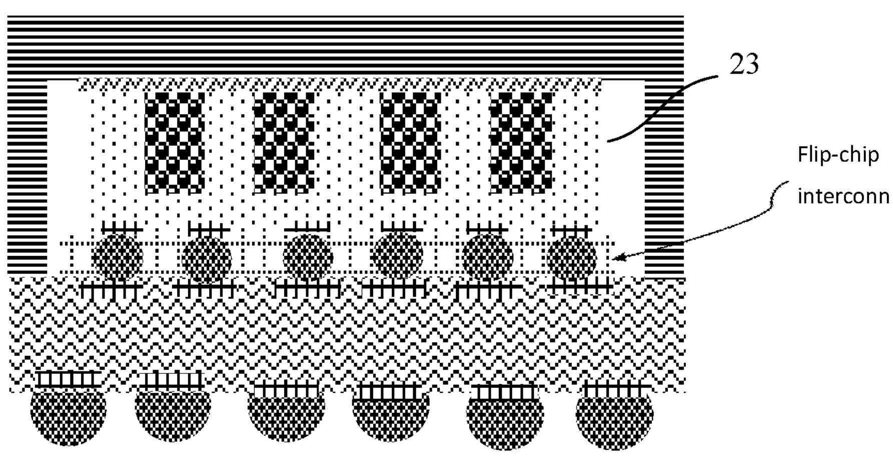
FIG. 18 shows a schematic structural diagram of a flip-chip thermally conductive semiconductor packaging structure according to one embodiment of the present disclosure.

As an example, the die packaging structure is a fan-out die packaging structure 21, but is not limited thereto; the die packaging structure may also be a 2.5D die packaging structure 22 as shown in FIG. 17, a flip-chip die packaging structure 23 as shown in FIG. 18, or other suitable packaging structures.

As an example, the thermally conductive members 113 comprise one or more of a Graphene thermally conductive member, an aluminum trioxide thermally conductive member, a ceramic thermally conductive member, and a metal thermally conductive member, wherein the metal thermally conductive member comprises, for example, indium.

As an example, each of the thermally conductive dies 10 may have N thermally conductive members 113, wherein N is a positive integer like 1, 2, 3, 4, 5, etc.

In summary, the present disclosed thermally conductive semiconductor packaging structure and method for preparing the same, by introducing thermally conductive members to a die, can convert the die into a thermally conductive die with good thermal conductivity and applicable to a wide range of packages, thereby further obtaining a thermally conductive semiconductor packaging structure with high thermal conductivity and improved heat dissipation performance.

The above-mentioned embodiments are merely illustrative of the principle and effects of the present disclosure instead of restricting the scope of the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for preparing a thermally conductive semiconductor packaging structure, comprising:

- providing a wafer, which comprises multiple sub-regions, wherein the wafer comprises a front side and a back side, wherein pads are provided on the front sides of the sub-regions;
- patterning the back sides of the sub-regions to form grooves, wherein the grooves include various shapes;
- filling the grooves with a thermally conductive material to form thermally conductive members;
- cleaning the backsides to expose the thermally conductive members;
- cutting the wafer along borders of the sub-regions to obtain thermally conductive dies;
- forming a die packaging structure by packaging one or more of the thermally conductive dies together, wherein each of the thermally conductive dies comprises a first surface and a second surface opposite to the first surface, with the first surface exposing the thermally conductive members, wherein the second surface is provided with an electrically interconnecting component which is electrically connected to the pads;
- providing a substrate, and electrically connecting the electrical interconnecting component to the substrate; and
- forming a heat dissipating cover over the substrate, wherein the heat dissipating cover is in contact with the thermally conductive members.

2. The method according to claim 1, wherein the die packaging structure constitutes a part of a fan-out packaging structure, a part of a 2.5D packaging structure, or a part of a flip-chip packaging structure.

3. The method according to claim 1, wherein the thermally conductive material comprises one or more of Graphene, aluminum trioxide, ceramics, and indium.

4. The method according to claim 1, wherein techniques for filling the grooves with the thermally conductive material to form the thermally conductive members comprises one of deposition, coating, curing and grinding.

5. The method according to claim 1, wherein techniques for forming the grooves comprises one or more of mechanical grooving, laser grooving, chemical etching, and plasma etching, and wherein the shapes of the grooves comprise one or more of linear, circular, rectangular, and trapezoidal.

6. The method according to claim 1, wherein there are N thermally conductive members formed in each of the thermally conductive dies, wherein N≥2.

* * * * *